(12) United States Patent
Okawa

(10) Patent No.: US 7,091,499 B2
(45) Date of Patent: Aug. 15, 2006

(54) ULTRAVIOLET IRRADIATING METHOD AND AN APPARATUS USING THE SAME

(75) Inventor: Yuji Okawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 23 days.

(21) Appl. No.: 10/776,221

(22) Filed: Feb. 12, 2004

(65) Prior Publication Data

US 2004/0180515 A1    Sep. 16, 2004

(30) Foreign Application Priority Data

Mar. 12, 2003    (JP)    ............................. 2003-066561

(51) Int. Cl.
| | |
|---|---|
| G01N 23/00 | (2006.01) |
| G01N 21/64 | (2006.01) |
| H01J 37/20 | (2006.01) |
| G01T 1/20 | (2006.01) |
| G01J 1/42 | (2006.01) |

(52) U.S. Cl. ................. 250/455.11; 250/365; 250/372; 250/461.1

(58) Field of Classification Search ............ 250/455.11
See application file for complete search history.

(56) References Cited

U.S. PATENT DOCUMENTS 5,590,787 A * 1/1997 Hodges ...................... 206/724
6,153,357 A * 11/2000 Okamoto et al. ........... 430/312
6,202,292 B1 * 3/2001 Farnworth et al. ............ 29/743
6,348,999 B1 * 2/2002 Summersgill et al. ....... 359/569
2001/0029088 A1   10/2001 Odajima et al.

FOREIGN PATENT DOCUMENTS

| GB | 2 307 759    | 6/1997 |
|---|---|---|
| JP | 59-21038     | 2/1984 |
| JP | 61-226933    | 10/1986 |
| JP | 3-180049     | 8/1991 |
| JP | 6-204335     | 7/1994 |
| JP | 06-204335 A1 | 7/1994 |

OTHER PUBLICATIONS

European Search Report, Application No.: 04003567.7-2203, date Mar. 27, 2006.

* cited by examiner

Primary Examiner—Jack Berman
Assistant Examiner—Jennifer Yantorno
(74) Attorney, Agent, or Firm—Rader, Fishman & Grauer PLLC

(57) ABSTRACT

An ultraviolet irradiating apparatus for emitting ultraviolet light toward a work piece. The work piece, e.g. a semiconductor wafer, is held by a ring-shaped frame through an ultraviolet sensitive adhesive tape applied to the back surface of the wafer. The apparatus includes an ultraviolet irradiating section having a regulating member disposed in a lower position of a support base. The regulating member is provided to limit a downward displacement of the wafer.

15 Claims, 4 Drawing Sheets

ULTRAVIOLET IRRADIATING METHOD AND AN APPARATUS USING THE SAME

BACKGROUND OF THE INVENTION (1) Field of the Invention

This invention relates to an ultraviolet irradiating apparatus for emitting ultraviolet light toward a work piece such as a semiconductor wafer or electronic part and a frame holding the work piece through an ultraviolet sensitive adhesive tape applied to the back surface of the work piece.

(2) Description of the Related Art

In a conventional process of manufacturing semiconductor wafers (hereinafter simply called "wafers") or electronic parts, work pieces are processed as held with an ultraviolet sensitive adhesive tape applied thereto.

The semiconductor manufacturing process includes a dicing step for cutting a wafer into chips, for example. In this dicing step, the wafer is mounted centrally of a ring-shaped frame, and held (supported) with an ultraviolet sensitive adhesive tape applied to the back surface of the wafer in a way to cover the ring-shaped frame as well.

That is, a semiconductor wafer fixed to a wafer support structure is cut by a cutter, leaving the adhesive tape adhering to the wafer, to avoid fragmenting and scattering of chips. Further, an ultraviolet sensitive adhesive tape is used because it has strong adhesion for withstanding impacts occurring in time of cutting, and in order to allow cut chips to separate easily from the adhesive tape in a die-bonding step following the dicing step. That is, the adhesive strength of this tape is lowered when irradiated by ultraviolet light, and this property of the tape is utilized.

In a specific example of ultraviolet irradiating apparatus, a work piece is enclosed in a cover, and an inert gas is fed into its interior. A predetermined quantity of ultraviolet light is emitted by opening and closing a shutter disposed between an ultraviolet lamp and the wafer (see Japanese Unexamined Patent Publication No. 6-204335).

However, the apparatus using the conventional ultraviolet irradiating method has the following drawbacks.

To meet the high-density packaging requirement today, a thinning process using wafers of large diameter (e.g. 300 mm) tends to result in an ever lessening strength of the wafers. Furthermore, due to the heat generated in time of ultraviolet irradiation, the adhesive tape tends to soften and become slack under the weight of such a large wafer. Consequently, there has arisen a problem of corners of adjoining diced chips rubbing against one another to be damaged.

When intervals between the chips or packages are reduced by slackening of the adhesive tape, an operating inconvenience will occur where, for example, individual chips cannot be recognized accurately in picking up the chips with a suction collet.

Moreover, the adhesive tape which has once slackened by heat cannot be restored. While a wafer with the adhesive tape in the slack state is transported to the bonding step, the chips could contact each other to be damaged. When sucking chips from a wafer joined with a ring-shaped frame with a suction collet for transport, the collet may fail to suck the chips accurately, thereby damaging the chips.

SUMMARY OF THE INVENTION

This invention has been made having regard to the state of the art noted above, and its principal object is to provide an ultraviolet irradiating method, and an ultraviolet irradiating apparatus using this method, for holding work pieces steadily without deforming an ultraviolet sensitive adhesive tape holding the work pieces.

The above object is fulfilled, according to this invention, by an ultraviolet irradiating method for emitting ultraviolet light toward a work piece and a frame holding the work piece through an ultraviolet sensitive adhesive tape applied to a back surface of the work piece, the method comprising a step of emitting ultraviolet light to the work piece while supporting an undersurface of the work piece held by the frame in time of ultraviolet irradiation of the work piece.

According to this invention, ultraviolet light is emitted toward a work piece held by a frame through an ultraviolet sensitive adhesive tape, while the undersurface of the work piece is supported. This limits a downward displacement of the work piece due to softening of the adhesive tape under the influence of heat in time of ultraviolet irradiation and slackening under the weight of the work piece. As a result, it is possible to reduce stress imposed on the work piece by slackening of the adhesive tape, and avoid damage to the work piece held.

Where work pieces are chips or various parts formed by dicing a semiconductor wafer and arranged in a two-dimensional array at predetermined intervals, the parts may be aligned while constantly maintaining the predetermined intervals without narrowing the intervals therebetween. Consequently, when picking up the parts with a suction collet from the adhesive tape, positions of the parts may be recognized accurately to pick up the parts accurately, thereby realizing an improvement in working efficiency.

In this invention, the frame, preferably, is a ring-shaped frame having an inside diameter of at least 300 mm. It is then possible to hold a large work piece of 300 mm or more. In this case, it is desirable to support the work piece against displacement. That is, the larger the inside diameter is, the larger area and greater weight of the work piece is borne by the adhesive tape. The adhesive tape would tend to slacken easily under the influence of heat in time of ultraviolet irradiation.

It is preferred that the work piece is a semiconductor wafer, glass component or semiconductor package substrate. In a process of manufacturing a semiconductor wafer, glass component or semiconductor package substrate, a downward displacement of such a product held by the frame may be limited in time of ultraviolet irradiation. That is, where a high processing accuracy is needed such as in processing precision components, an excessive stress may be prevented from occurring with each work piece in time of handling, e.g. transporting, the work piece by precluding deformation of the ultraviolet sensitive type adhesive tape.

The object of this invention noted hereinbefore may be fulfilled, in another aspect of the invention, by an ultraviolet irradiating apparatus for emitting ultraviolet light toward a work piece and a ring-shaped frame holding the work piece through an ultraviolet sensitive adhesive tape applied to a back surface of the work piece, the apparatus comprising a regulating device for limiting a downward displacement of the work piece held by the ring-shaped frame in time of ultraviolet irradiation of the work piece.

According to this invention, when ultraviolet light is emitted toward a work piece held by a ring-shaped frame through an ultraviolet sensitive adhesive tape, the regulating device limits a downward displacement of the work piece due to a deformation of the adhesive tape. That is, the regulating device prevents a downward displacement of the work piece due to softening of the adhesive tape under the influence of heat in time of ultraviolet irradiation and slackening under the weight of the work piece.

Thus, where the work piece is a semiconductor wafer, chips formed by a dicing process are maintained in a substantially horizontal state. Adjoining chips are protected from damage done by mutual contact occurring with slackening of the adhesive tape. Further, the chips are transported in the substantially horizontal state to a bonding step, for allowing a suction collet to hold the chips accurately by suction.

Where work pieces are chips or various parts formed by dicing a semiconductor wafer and arranged in a two-dimensional array at predetermined intervals, the parts may be aligned while constantly maintaining the predetermined intervals without narrowing the intervals therebetween. Consequently, when picking up the parts with a suction collet from the adhesive tape, positions of the parts may be recognized accurately to pick up the parts accurately, thereby realizing an improvement in working efficiency. Thus, the method set out in claim 1 may be implemented effectively.

Preferably, a distance from the undersurface of the work piece to the regulating device is set to at most 3 mm. This setting is effective for maintaining the work piece supported in a substantially horizontal state by the ring-shaped frame.

Preferably, the regulating device is formed of glass plate. The glass plate may comprise soda glass or tempax glass. It is further desirable that the glass plate has a thickness of at least 100 μm.

Such materials have sufficient rigidity for supporting the work piece in a way to limit a downward displacement thereof. At the same time, these materials are effective for transmitting ultraviolet light to cure the adhesive of the ultraviolet sensitive adhesive tape.

Furthermore, the regulating device, preferably, is formed of metal wires arranged in a grid. It is still more desirable that the metal wires arranged in grid form have a thickness of at most 0.5 mm, and have intervals therebetween of at most 20 mm.

It is also desirable that the regulating device is formed of a cold filter.

Such materials have sufficient rigidity for supporting the work piece in a way to limit a downward displacement thereof. At the same time, these materials are effective for transmitting ultraviolet light to cure the adhesive of the ultraviolet sensitive adhesive tape.

Further, the work piece, preferably, is a semiconductor wafer, glass component or semiconductor package substrate. That is, where a high processing accuracy is needed such as in processing precision components, an excessive stress may be prevented from occurring with each work piece in time of handling, e.g. transporting, the work piece by precluding deformation of the ultraviolet sensitive type adhesive tape.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described hereinafter with reference to the drawings.

Figure 1:
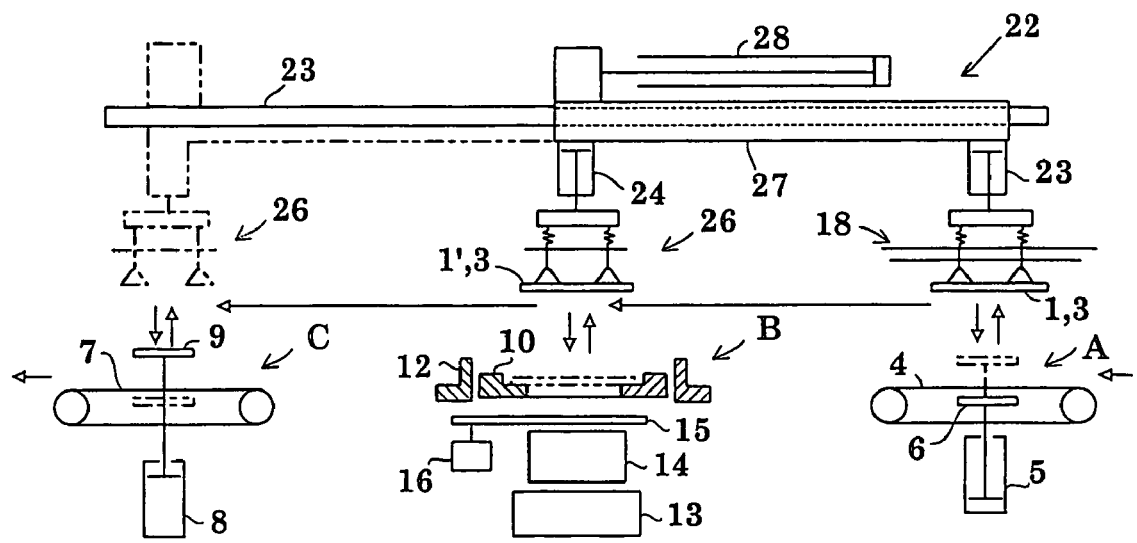
FIG. 1 is a front view showing an outline of a mechanical portion of an apparatus according to this invention.
Figure 2:
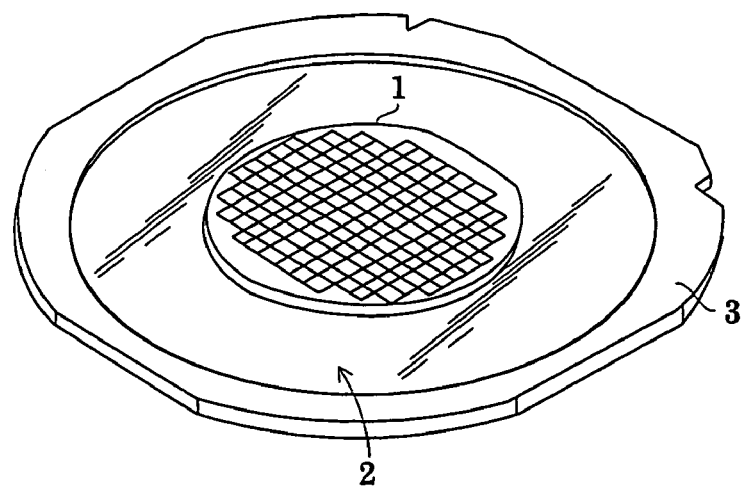
FIG. 2 is a perspective view of a work piece.

FIG. 1 is a front view showing an outline of a mechanical portion of an ultraviolet irradiating apparatus according to this invention. FIG. 2 is a perspective view of a work piece held by a frame to be processed. A semiconductor wafer (hereinafter simply called "wafer") has an ultraviolet sensitive adhesive tape larger than the wafer applied to the back surface thereof. The adhesive tape is applied at peripheries thereof also to a ring-shaped frame. In this embodiment, the wafer is transported as integrated with the ring-shaped frame.

The ultraviolet irradiating apparatus in this embodiment includes a work piece loading section A for receiving a ring-shaped frame 3 integrated with a wafer 1 from a dicing apparatus, not shown, disposed in an upstream location, an ultraviolet irradiating section B, and a work piece unloading section C for delivering the wafer 1 after an ultraviolet irradiating process to a treating apparatus, not shown, disposed in a downstream location (e.g. a stocker for storing the processed wafer 1 as held by the ring-shaped frame 3 in an appropriate cassette, or a die bonding apparatus). The work piece loading section A may share the stocker with the work piece unloading section C for loading and unloading work pieces into/from cassettes.

The work piece loading section A includes a loading belt 4 extending along a processing line, and a work piece table 6 vertically movable, with the wafer 1 placed thereon, by an air cylinder 5. The work piece unloading section C includes an unloading belt 7 extending along the processing line, and a work piece table 9 vertically movable by an air cylinder 8.

Figure 3:
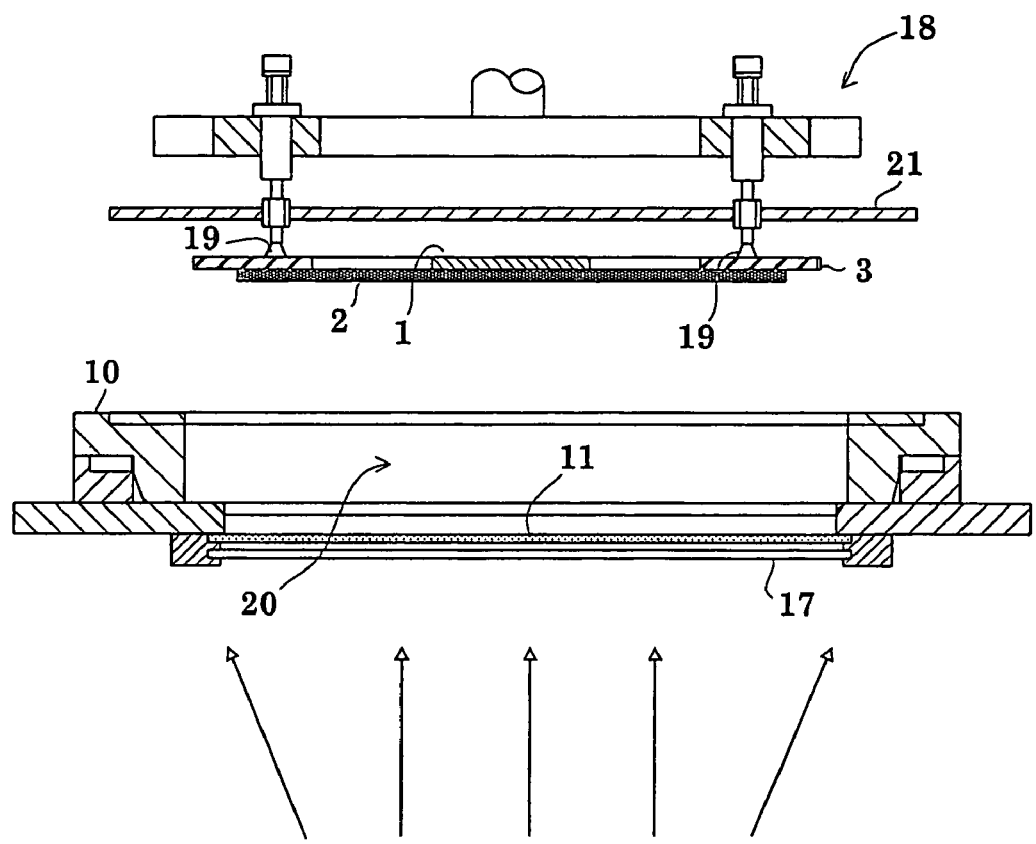
FIG. 3 is a view showing a principal part of the apparatus according to this invention.

The ultraviolet irradiating section B, as shown in FIG. 1, and in an enlarged view of FIG. 3, includes a ring-shaped support base 10 for receiving a frame portion of the ring-shaped frame 3, a regulating member 11 for limiting a downward displacement of the wafer 1 with the ring-shaped frame 3 supported by the support base 10, a cylindrical housing 12 enclosing the support base 10, an ultraviolet lamp 13 disposed in a lower position for emitting ultraviolet light toward the undersurface of the wafer 1, an ultraviolet flux barrel 14, a shutter 15 and a shutter drive motor 16.

As shown in FIG. 3, a cold filter 17 is disposed at the bottom of the support base 10 for shielding infrared light.

Figure 4:
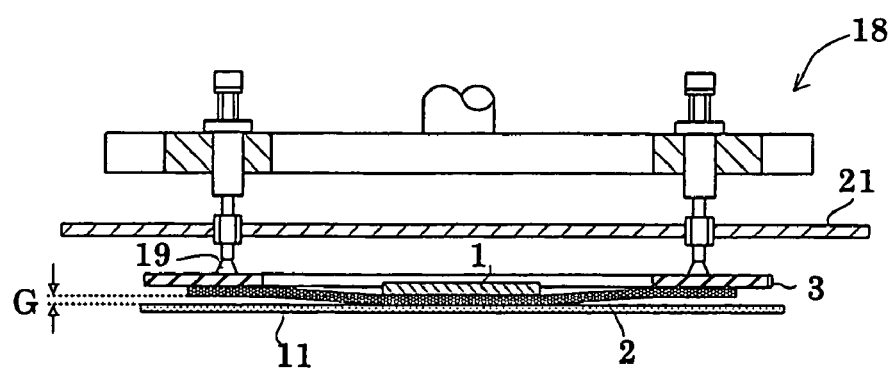
FIG. 4 is a schematic view showing a wafer adjusted in position.

The regulating member 11, which forms a characterizing portion of the apparatus in this embodiment, serves to maintain the wafer 1 held by the ring-shaped frame 3 in a substantially horizontal posture against the adhesive tape 2 softening under the influence of heat in time of ultraviolet irradiation and slackening under the weight of the wafer 1. As shown in FIG. 4, the regulating member 11 sets a gap G not exceeding 3 mm from its surface to the adhesive tape attaching surface of the wafer 1 in horizontal posture. A gap exceeding 3 mm would allow the adhesive tape 2 to slacken with the heat and the weight of wafer 1. Thus, it would be impossible to hold the wafer 1 in a substantially horizontal posture.

The regulating member 11 may be formed of any suitable material that transmits ultraviolet light, such as soda glass or tempax glass. It is also possible to use the cold filter 17 as the regulating member 11.

Where these various types of glass are used as the regulating member 11, the thickness, preferably, is at least 100 μm. With a thickness less than 100 μm, the regulating member 11 would have insufficient rigidity and would not be able to support reliably, in a positionally adjusted state, a large and heavy 300 mm wafer 1, for example. It is desirable to use a polyester film or sheet of 150 μm or lager.

Where a 300 mm wafer 1 is processed, the ring-shaped frame 3 used for holding the wafer 1 has an inside diameter of at least 300 mm.

A work piece suction mechanism 18 has a plurality of (e.g. four) suction pads 19 for supporting the ring-shaped frame 3 by suction. The wafer 1 and ring-shaped frame 3 are placed in a processing chamber 20 in time of ultraviolet irradiation. A cover plate 21 is disposed above the suction pads 19 for closing the processing chamber 20 when filling the processing chamber 20 with nitrogen gas for ultraviolet irradiation.

Referring to FIG. 1 again, the apparatus in this embodiment includes a traverse mechanism 22 for suction-supporting and transporting the ring-shaped frame 3 integrated with the wafer 1 from the work piece loading section A to the ultraviolet irradiating section B and from the ultraviolet irradiating section B to the work piece unloading section C.

This traverse mechanism 22 includes a movable frame 27 having two work piece suction mechanisms 18 and 26 attached to opposite ends thereof to be vertically movable by air cylinders 23 and 24, respectively. The movable frame 27 is moved by an air cylinder 28 forward and backward along a guide rail 29 extending along the processing line. One of the suction mechanisms 18 feeds a wafer 1 from the work piece loading section A to the ultraviolet irradiating section B, while the other suction mechanism 26 deliver a wafer 1' processed in the ultraviolet irradiating section B to the work piece unloading section C.

In this embodiment, as described above, a wafer 1 having undergone a dicing process and joined with the ring-shaped frame 3 is transported to the ultraviolet irradiating section B and received by the support base 10. At this time, the regulating member 11 limits a downward displacement of the wafer 1 so that it does not fall below a predetermined height. That is, when the ultraviolet lamp 13 emits ultraviolet light, the ultraviolet sensitive adhesive tape 2 softens under the influence of heat and expands under the weight of the wafer 1. The regulating member 11 prevents a descent (displacement) of the wafer 1 occurring at this time.

Thus, the wafer 1 is held by the ring-shaped frame 3 through the adhesive tape 2 in a substantially horizontal state. As a result, corners of adjoining chips formed after a dicing process are protected from damage done by mutual contact. Further, the processed wafer 1 is transported in the substantially horizontal state after the adhesive is cured by ultraviolet irradiation in the ultraviolet irradiating section B. Thus, in a subsequent bonding step, for example, a suction collet can transport chips by accurately holding the chips by suction without damage to the corners of the chips.

Further, the chips may be maintained in an aligned state with predetermined intervals constantly secured instead of reducing the intervals. When picking up the chips (parts) with a suction collet from the adhesive tape, positions of the chips may be recognized accurately, thereby realizing an improvement in working efficiency.

Figure 5:
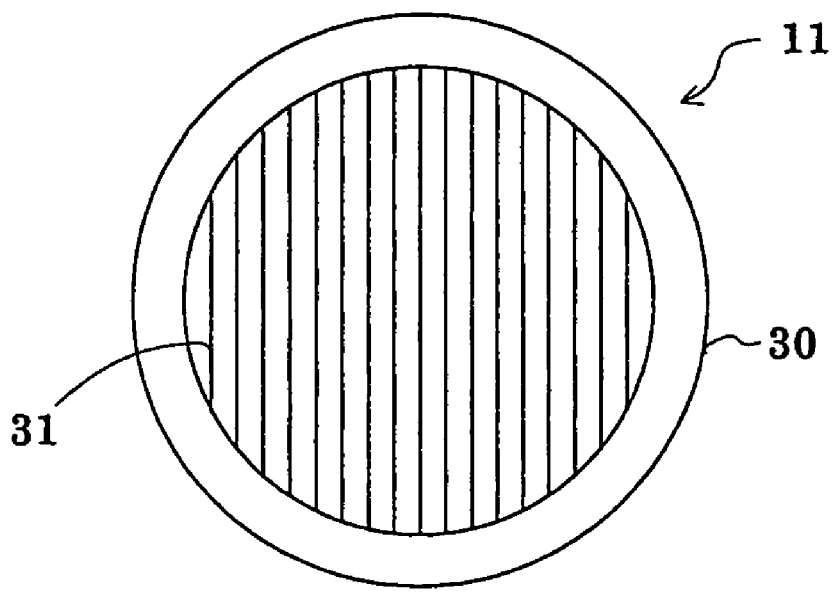
FIG. 5 is a view showing a modified regulating member.
Figure 6:
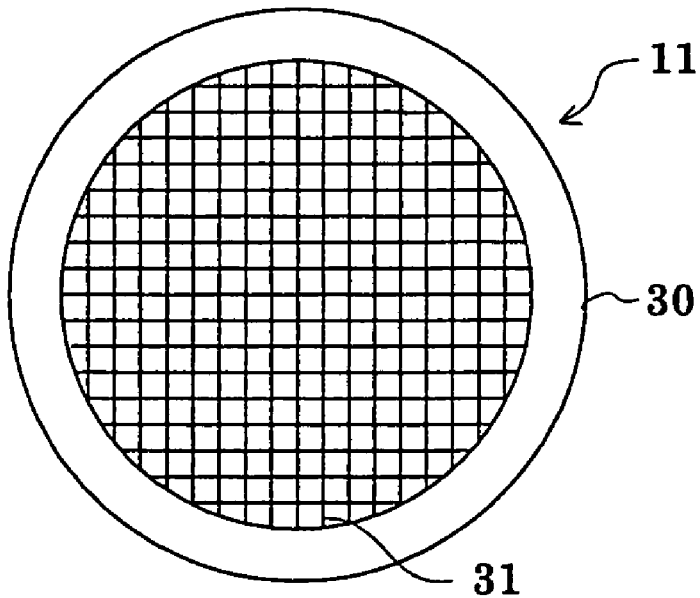
FIG. 6 is a view showing another modified regulating member.

This invention is not limited to the above embodiment, but may be modified as follows:

(1) The apparatus in the above embodiment uses glass or plastic as the regulating device. This invention is not limited to such, but may use any material that allows the wafer 1 to be irradiated with ultraviolet light. As shown in FIG. 5, for example, a frame 30 may have thin metal wires 31 attached thereto as arranged parallel to one another at predetermined intervals. Alternatively, as shown in FIG. 6, the thin metal wires 31 may be arranged to form a grid. Where the metal wires 31 are used as in FIGS. 5 and 6, the metal wires are arranged at intervals of 3–20 mm, and have a diameter of 0.5 mm or less and, preferably 0.4 mm or less. If the intervals exceed 20 mm or the diameter exceeds 0.5 mm, the wires will produce shadows on the back surface of the wafer 1 in time of ultraviolet irradiation, thus failing to perform a uniform ultraviolet irradiation.

However, variations in ultraviolet irradiation may be avoided by emitting ultraviolet light while rotating the regulating member 11 shown in FIG. 5 or 6 or while rotating the wafer 1 integrated with the ring-shaped frame 3 supported by suction.

Figure 7:
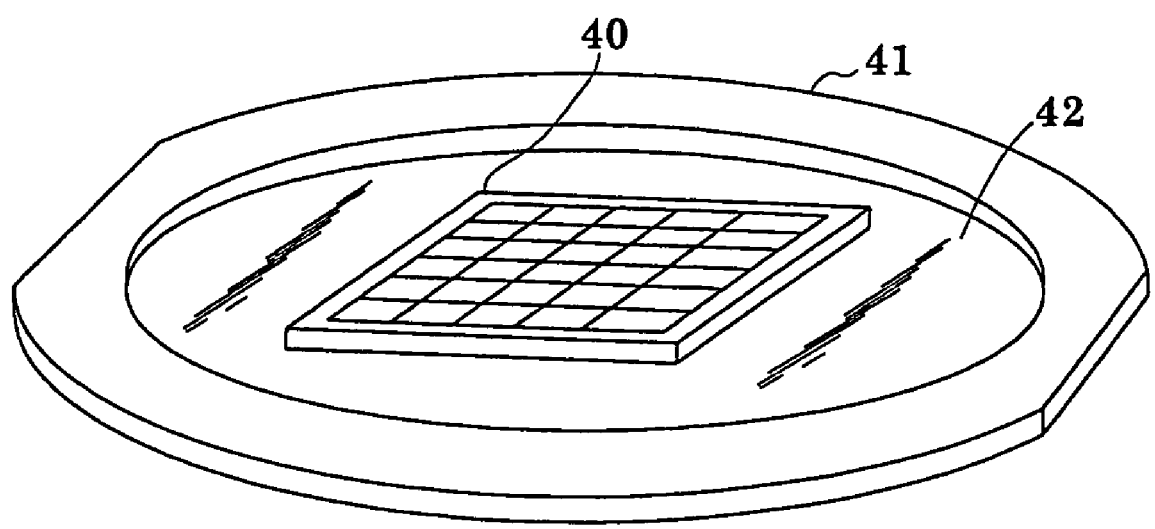
FIG. 7 is a perspective view showing another example of work piece.

(2) In the foregoing embodiment, the wafer 1 is integrated with the ring-shaped frame 3. As shown in FIG. 7, a semiconductor package substrate 40 may be held by a ring-shaped frame 41 through an adhesive tape 42. A glass component may be used in place of the semiconductor package substrate 40.

This invention may be embodied in other specific forms without departing from the spirit or essential attributes thereof and, accordingly, reference should be made to the appended claims, rather than to the foregoing specification, as indicating the scope of the invention.

What is claimed is:

1. An ultraviolet irradiating method for emitting ultraviolet light toward a work piece and a frame holding said work piece through an ultraviolet sensitive adhesive tape applied to a back surface of the work piece, said method comprising:
    a step of placing a regulating member separate from the adhesive tape applied to the back surface of the work piece, with a predetermined clap downward from a back surface of the adhesive tape prior to emitting ultraviolet light;
    a step of emitting ultraviolet light to said work piece; and
    a step of stopping, with said regulating member, the adhesive tape and the work piece closing said clap formed between the back surface of the adhesive tape and the regulating member and falling as a result of the adhesive tape softening and slackening under influence of heat, and the adhesive tape and the work piece falling together under weight of the work piece, in the step of emitting ultraviolet light.

2. An ultraviolet irradiating method as defined in claim 1, wherein said frame is a ring-shaped frame having an inside diameter of at least 300 mm.

3. An ultraviolet irradiating method as defined in claim 1, wherein said work piece is a semiconductor wafer, glass component or semiconductor package substrate.

4. An ultraviolet irradiating apparatus for emitting ultraviolet light toward a work piece and a ring-shaped frame holding said work piece through an ultraviolet sensitive adhesive tape applied to a back surface of the work piece, said apparatus comprising:
    regulating means disposed at a predetermined distance from a back surface of said adhesive tape, prior to emitting ultraviolet light, for stopping the adhesive tape and the work piece closing said gap formed between the back surface of the adhesive tape and the regulating member and falling as a result of the adhesive tape softening and slackening under influence of heat, and the adhesive tape and the work piece falling together under weight of the work piece, during an ultraviolet light emission toward said work piece.

5. An ultraviolet irradiating apparatus as defined in claim 4, wherein a distance from an undersurface of said work piece to said regulating means is set to at most 3 mm.

6. An ultraviolet irradiating apparatus as defined in claim 4, wherein said regulating means is formed of glass plate.

7. An ultraviolet irradiating apparatus as defined in claim 6, wherein said glass plate comprises soda glass or borosilicate glass.

8. An ultraviolet irradiating apparatus as defined in claim 7, wherein said glass plate has a thickness of at least 100 μm.

9. An ultraviolet irradiating apparatus as defined in claim 4, wherein said regulating means is formed of a plastic penetrable by ultraviolet light.

10. An ultraviolet irradiating apparatus as defined in claim 9, wherein said plastic is a polyester film or polyester sheet.

11. An ultraviolet irradiating apparatus as defined in claim 10, wherein said polyester film or polyester sheet has a thickness of at least 150 μm.

12. An ultraviolet irradiating apparatus as defined in claim 4, wherein said regulating means is formed of metal wires arranged in a grid.

13. An ultraviolet irradiating apparatus as defined in claim 12, wherein said metal wires arranged in a grid have a thickness of at most 0.5 mm, and have intervals therebetween of at most 20 mm.

14. An ultraviolet irradiating apparatus as defined in claim 4, wherein said regulating means is formed of a cold filter.

15. An ultraviolet irradiating apparatus defined in claim 4, wherein said work piece is a semiconductor wafer, glass component or semiconductor package substrate.

* * * * *